United States Patent
Nakamura

(10) Patent No.: US 7,920,999 B2
(45) Date of Patent: Apr. 5, 2011

(54) METHOD OF PREDICTING INTERNAL GETTERING BEHAVIOR IN SILICON SUBSTRATES AND STORAGE MEDIUM STORING PROGRAM FOR PREDICTING INTERNAL GETTERING BEHAVIOR

(75) Inventor: Kozo Nakamura, Omura (JP)

(73) Assignee: Sumco Techxiv Corporation, Kanagawa (JP)

( * ) Notice: Subject to any disclaimer, the term of this patent is extended or adjusted under 35 U.S.C. 154(b) by 484 days.

(21) Appl. No.: 11/991,044

(22) PCT Filed: Jun. 5, 2006

(86) PCT No.: PCT/JP2006/311224
§ 371 (c)(1),
(2), (4) Date: Feb. 26, 2008

(87) PCT Pub. No.: WO2007/029385
PCT Pub. Date: Mar. 15, 2007

(65) Prior Publication Data
US 2009/0259448 A1   Oct. 15, 2009

(30) Foreign Application Priority Data

Sep. 2, 2005 (JP) .................................. 2005-254994

(51) Int. Cl.
*G06G 7/48* (2006.01)
(52) U.S. Cl. .......................................................... 703/6
(58) Field of Classification Search ......... 703/6; 117/13
See application file for complete search history.

(56) References Cited

FOREIGN PATENT DOCUMENTS

| | | |
|---|---|---|
| JP | 11-283986 | 10/1999 |
| JP | 2002-110684 | 4/2002 |
| JP | 2003-257983 | 9/2003 |
| JP | 2003-282576 | 10/2003 |
| JP | 2003-318181 | 11/2003 |
| KR | 2004-31845 | 1/2004 |

OTHER PUBLICATIONS

H. Hieslmair, A.A. Istratov, S.A. McHugo, C. Flink, T. Heiser, E.R. Weber, "Gettering of iron by oxygen precipitates" Applied Physics Letters, vol. 72, No. 12, Mar. 23, 1998, pp. 1460-1462.*
Gilles, Dieter et al.; "Mechanism of Internal Gettering of Interstitial Impurities in Czochralski-Grown Silicon"; Physical Review Letters; Jan. 1990, vol. 64, pp. 196-199, The American Physical Society.

(Continued)

*Primary Examiner* — Dwin M Craig
(74) *Attorney, Agent, or Firm* — Husch Blackwell

(57) ABSTRACT

Internal gettering behavior in a silicon substrate is predicted by using an arithmetic expression established among an initial iron contamination concentration $C_{ini}$ in the silicon substrate, a density N of oxygen precipitates, a radius R of the oxygen precipitates, internal gettering heat treatment temperature T, internal gettering heat treatment time t, and a concentration C(t) of iron (Fe) remaining in the silicon substrate after a heat treatment. In the prediction of internal gettering behavior in the silicon substrate, an arithmetic expression is added considering a process in which nuclei of a contaminant heavy metal silicide are generated on the surface of the oxygen precipitates, and a process in which the contaminant heavy metal is gettered by the oxygen precipitates having the contaminant heavy metal silicide nuclei generated on the surface thereof. This invention is also applicable for internal gettering of a contaminant heavy metal other than iron (Fe), such as copper (Cu), nickel (Ni) or the like.

8 Claims, 5 Drawing Sheets

OTHER PUBLICATIONS

Tobe, S. et al, "Development of Simulator for Various Gettering Techniques—Application to Low Temperature Process", The Japan Society of Applied Physics, Silicon Technology, 1998, No. 5 pp. 44-49.

Heislmair, H. et al., "Analysis of Iron Precipitation in Silicon as a Basis for Gettering Simulations," Journal of Electrochemical Society, Dec. 1998, vol. 145, No. 12, pp. 4259-4264, The Electrochemical Society Inc.

Sueoka, K., "Modeling of Internal Gettering for NI and CU Contamination by Oxide Precipitates in CZ-Si Wafers," JSAP Catalogue No. AP042205, No. 59 Feb. 6, 2004.

Sueoka, K., "Modeling of Internal Gettering of Nickel and Copper by Oxide Precipitates in Czochralski-Si Wafers," Journal of the Electrochemical Society, 2005, vol. 152 (10), pp. G731-G735.

Yamada, H. et al., "Proceedings of the Forum on the Science and Technology of Silicon Materials 2003," Nov. 25-27, 2003, pp. 79-89, Organizing Committee of the Silicon Materials Science and Technology Forum, Kanagawa.

International Search Report for PCT/JP2006/311224.

* cited by examiner

METHOD OF PREDICTING INTERNAL GETTERING BEHAVIOR IN SILICON SUBSTRATES AND STORAGE MEDIUM STORING PROGRAM FOR PREDICTING INTERNAL GETTERING BEHAVIOR

TECHNICAL FIELD

This invention relates to a method of predicting internal gettering behavior in silicon substrates and a storage medium storing a program for predicting such behavior.

BACKGROUND ART

A silicon single crystal wafer principally used as a wafer for manufacture of IC devices such as semiconductor integrated circuits is fabricated by slicing a silicon single crystal grown by the Czochralski method (hereafter referred to as the CZ method) and polishing the sliced wafer.

Various heat treatments are performed in a variety of processes depending on configuration of an IC device to be manufactured during the manufacture thereof. Possible contamination of the wafer with a heavy metal such as iron (Fe), Ni, and Cu during these heat treatment processes will lead to generation of defects and electrical levels near the surface of the semiconductor silicon substrate, resulting in deteriorated characteristics of the device.

In order to avoid this, the contaminant heavy metal must be removed by gettering (capturing) from the surface area of the wafer in which the device is to be formed. Among known methods of gettering, representative are an internal gettering (IG) method to capture heavy metals within the silicon wafer and an external gettering (EG) method to capture heavy metals on the rear side of the silicon wafer. This invention involves the internal gettering.

It has been known that the internal gettering ability of silicon wafers is related with a precipitation amount and precipitation state of oxygen precipitates.

Specifically, a silicon single crystal grown by the CZ method inevitably contains oxygen in the course of pull-up growth. When the oxygen-containing silicon wafer is subjected to a heat treatment, the contained oxygen will precipitate to form oxygen precipitates within the wafer. The oxygen precipitates thus formed has an effect of gettering contaminant heavy metals. In general, the internal gettering ability against the heavy metals is increased as the precipitation amount of the oxygen precipitates is increased.

However, if the precipitation amount is too high, the mechanical strength of the silicon wafer will be deteriorated, leading to more occurrence of warpage or the like during the device manufacturing processes. Accordingly, the higher oxygen precipitation amount does not necessarily imply a favorable result. The oxygen precipitation must be controlled according to the contamination status of the device and the heat treatment process so that a required amount of oxygen precipitation can be obtained.

Among the contaminant heavy metals, Ni and Cu have a particularly high diffusion rate within the silicon wafer. Therefore, these heavy metals can be gettered sufficiently effectively during a normal cooling process without the need of performing a heat treatment for capturing the heavy metals if a certain amount of oxygen precipitates is preliminarily precipitated within the wafer.

Patent Document 1 listed below describes an invention relating to measurement of internal gettering ability against Ni. Patent Document 2 listed below also describes an invention relating to heat treatments performed to provide the internal gettering ability against Cu based on simulation.

However, among the contaminant metals, iron (Fe) presents a lower diffusion rate within the silicon wafer in comparison with Ni and Cu, and is thus most difficult to getter. Moreover, iron (Fe) is a heavy metal which is the most typically contaminant during the device manufacturing processes.

In order to have Fe atoms captured by the oxygen precipitates, it is necessary to design a heat treatment process such that the internal gettering is performed effectively, or to sufficiently increase the precipitation amount of oxygen precipitates. It is therefore crucial to have correct understanding of the relation between the internal gettering ability against iron (Fe) and the precipitation amount and precipitation state of the oxygen precipitates.

In Non-Patent Document 1 list below, Gilles et al. for the first time formulated the relation between the internal gettering ability against iron (Fe) and the precipitation state of oxygen precipitates, using a model (hereafter referred to as the Gilles model) as described below, and proved the effectiveness of their method through experiments.

In the first place, they derived an expression representing the internal gettering ability in the following manner.

They assumed that supersaturated Fe atoms would precipitate on the surface of spherical oxygen precipitates with a radius R within a silicon wafer. They also assumed that the concentration of iron (Fe) on the surface of the oxygen precipitates was equivalent to the solubility of iron (Fe). Based on the assumptions, a diffusion flux J (atoms/s) of Fe atoms to a single oxygen precipitate can be represented by the following expression (1) through regular expression development.

$$J = 4\pi RD(C(t) - C^{eq}) \tag{1}$$

In the expression (1), D denotes a diffusion coefficient ($cm^2/s$) of iron (Fe) and is represented as $D = 1.3 \times 10^{-3} \exp(-0.68\ eV/k_b T)$. C(t) denotes a concentration ($atoms/cm^3$) of iron (Fe) within a silicon wafer at time t. $C^{eq}$ denotes a solubility ($atoms/cm^3$) of iron (Fe) and is represented as $C^{eq} = 4.3 \times 10^{22} \exp(-2.1\ eV/k_b T)$. $k_b$ denotes a Boltzmann's constant and is represented as $k_b = 8.6257 \times 10^{-5}$ (eV/K). T denotes absolute temperature (K).

When the oxygen precipitates density is N ($units/cm^3$), the time change $\partial C(t)/\partial t$ of the iron (Fe) concentration C(t) in the wafer can be represented by the following expression (2).

$$\partial C(t)/\partial t = -4\pi RD(C(t) - C^{eq})N \tag{2}$$

It was assumed here that the initial contamination concentration of iron (Fe) represented by $C_{ini}$ ($atoms/cm^3$) would attenuate to the solubility of iron (Fe) after infinite time. Therefore, $C(t) = C_{ini}$ at $t=0$, and $C(t) = C^{eq}$ at $t=\infty$. Based on these conditions, the solution of the expression (2) is represented by the following expressions (3) and (4).

$$(C(t) - C^{eq})/(C_{ini} - C^{eq}) = \exp(-t/\tau) \tag{3}$$

$$1/\tau = 4\pi RDN \tag{4}$$

In these expressions, $\tau$ is a time which is required for the iron (Fe) concentration normalized in the form, for example of the left side of the expression (3) to become 1/e (e=base of natural logarithm, or 2.718) as a result of gettering, and is referred to as relaxation time. $1/\tau$ corresponds to a gettering rate.

Gilles et al. conducted experiments under conditions where $C_{ini}$ was up to $10^{15}$ ($atoms/cm^3$), and the temperature during internal gettering was set to between 200 and 300° C., and confirmed that the radius R and density N of the oxygen precipitates dominated the gettering rate (1/τ) in the form as represented by the expressions (3) and (4).

The Gilles model indicates that the time change of the iron (Fe) concentration normalized in the form for example of the left side of the expression (3) remains same regardless of the initial concentration $C_{ini}$. This is commonly observed in diffusion phenomena.

Further, while the expressions (3) and (4) are obtained as solution of the expression (2) with the temperature being fixed, the solution can be obtained also for an actual heat treatment process involving temperature change by directly solving the expression (2) using the finite difference method, and calculating the change from the initial value.

However, there have been reported two facts that cannot be explained based on the Gilles model.

One of the facts is reported by Tobe et al., in Patent Documents 3 and 4 and Non-Patent Document 2 listed below.

They found, as a result of experiments, that when the initial contamination concentration was varied from $8×10^{12}$ (atoms/cm³) to $2×10^{14}$ (atoms/cm³), the iron (Fe) concentration normalized as in the left-hand side of the expression (3) changed significantly in dependence on the initial contamination concentration $C_{ini}$. Specifically, they found 1/τ representing the gettering rate in the expression (3) varied significantly in dependence on the initial contamination concentration $C_{ini}$ of iron (Fe). It is difficult to explain the phenomenon found by Tobe et al. by using the Gilles model in which the relaxation time τ does not depend on the initial iron (Fe) concentration $C_{ini}$.

Tobe et al. therefore proposed their own model (hereafter referred to as the Tobe model) in Patent Documents 3 and 4 to explain the dependency of the relaxation time τ on the initial contamination concentration. Specifically, the Tobe model assumes spheres of iron silicide (contaminant heavy metal silicide; $FeSi_2$) composed of a number of iron (Fe) atoms obtained by dividing the total number of supersaturated iron (Fe) atoms in the silicon wafer by the number of oxygen precipitates. They assert that the dependency of the expression (3) on the initial contamination concentration can be explained by assigning the radius of the spheres to the radius R of the oxygen precipitates in the expression (4). Although it is not clearly known what physical meaning this model has, it is reported that the experiment results can be explained sufficiently based on this assumption.

However, the Tobe model does not consider at all the effects of the radius R of the oxygen precipitates on the internal gettering ability. Specifically, in the Tobe model, the radius R of the oxygen precipitates is deleted by substituting the radius R of the oxygen precipitates with the radius of iron silicide alone. Therefore, according to the Tobe model, the radius R of the oxygen precipitates does not contribute in any way to the result of prediction of the internal gettering behavior.

It is well known, however, that the size (radius R) of oxygen precipitates as well as the density N thereof has a strong effect on the internal gettering ability against iron.

Tobe et al. proposed, in Patent Document 5 listed below, a method of evaluating the radius R of the oxygen precipitates from the measurement result of the iron (Fe) concentration by creating a calibration curve is to represent the relation between the radius R of oxygen precipitates and the iron (Fe) concentration after a gettering heat treatment. This method was devised by focusing on the fact that the change in concentration of iron (Fe) due to gettering was sensitive to the radius R of the oxygen precipitates.

Nevertheless, Patent Documents 3 and 4 make no consideration to the effect given by the radius R of the oxygen precipitates to the internal gettering ability. It is therefore believed that the prediction of internal gettering behavior is possible only under a specific condition. However, it cannot be known from Patent Documents 3 and 4 what range of the radius R of the oxygen precipitates corresponds to such condition.

Patent Document 5 also only shows, by way of experiments, the relation between the iron (Fe) concentration after a heat treatment and the density N and radius R of oxygen precipitates under a specific condition that heat treatment is conducted at 600° C. for 20 minutes when the initial iron (Fe) contamination concentration is $10^{13}$ (atoms/cm³). Thus, in Patent Document 5, the relation among the internal gettering ability, the initial iron (Fe) contamination concentration $C_{ini}$, and the density N and radius R of the oxygen precipitates remains unclear.

The other fact that cannot be explained by the Gilles model is reported by Hieslmair et al. in Non-Patent Document 3 listed below.

Specifically, Hieslmair et al. conducted experiments while variously changing the density N of oxygen precipitates and the heat treatment temperature during internal gettering. The initial concentration of iron (Fe) was in the range of 2 to $4×10^{13}$ (atoms/cm³). They found relation between the gettering heat treatment time and the iron (Fe) concentration, and fit the found relation to the expression (3) to obtain the relaxation time τ in the gettering reaction. Using the relaxation time τ thus obtained, they found the density at the effective gettering site by using the expression (4). As a result, when the density N of the oxygen precipitates was $10^{109}$ (units/cm³) or lower, the effective gettering site density did not depend on temperature and was substantially identical with the density N of the oxygen precipitates. However, when the density N of the oxygen precipitates was $10^{109}$ (units/cm³) or higher, it was found that that the ratio of the density N of the oxygen precipitates to the effective gettering site density decreased remarkably as the heat treatment temperature became higher. The gettering of iron (Fe) is believed to be most effective in a range of heat treatment temperature between 600 and 700° C. Further, it is generally believed that the density N of the oxygen precipitates effective to the internal gettering is $10^9$ (units/cm³) or higher. Hieslmair et al. report that when experiments are conducted under these conditions, the ratio obtained by dividing the effective gettering site density by the density N of the oxygen precipitates is reduced to near 1/100. This means that the expressions (3) and (4) of the Gilles model do not work at all in a practical range of gettering heat treatment temperature and or in a practical range of of the density N of the oxygen precipitates.

As described above, conventionally, the internal gettering behavior in a silicon substrate could be predicted substantially correctly only under limited conditions, but correct prediction of the behavior was not possible under practical conditions of gettering temperature and oxygen precipitates density. Moreover, there was even no means for predicting the behavior based on the initial contamination concentration.

[Patent Document 1]
Japanese Patent Application Laid-Open No. 2004-31845
[Patent Document 2]
Japanese Patent Application Laid-Open No. 2003-318181
[Patent Document 3]
Japanese Patent Application Laid-Open No. H11-283986
[Patent Document 4]
Japanese Patent Application Laid-Open No. 2003-282576
[Patent Document 5]
Japanese Patent Application Laid-Open No. 2003-257983

[Non-Patent Document 1]
D. Gilles, and E. R. Weber: Physical Review Letters, Vol. 64, No. 2 (1990), p 196

[Non-Patent Document 2]
Tobe, Hirano, and Hayamizu: The Japan Society of Applied Physics, Silicon Technology, No. 5, 1998, p 44

[Non-Patent Document 3]
H. Hieslmair, A. A. Istratov, S. A. McHugo, C. Flink and E. R. Weber: J. Electrochemical Society, Vol. 145, No. 12 (1998) p 4259

DISCLOSURE OF THE INVENTION

Problems to be Solved by the Invention

The iron (Fe) concentration of after gettering heat treatment depends on the density N and radius R of oxygen precipitates and the initial iron (Fe) contamination concentration $C_{ini}$. The iron (Fe) concentration after gettering heat treatment also depends on internal gettering heat treatment temperature and heat treatment time.

However, the conventional simulation was effective only under limited conditions, and was not applicable under practical conditions of gettering heat treatment temperature or density of oxygen precipitates. Moreover, the behavior depending on the initial iron (Fe) contamination concentration, which is important in practical prediction, could not be predicted by such simulation.

Consequently, there have conventionally been no other choice but to employ a method to evaluate the internal gettering ability by actually measuring the concentration of a contaminant heavy metal (iron) after a heat treatment instead of relying on the simulation. Specifically, there have conventionally been no adequate design indexes to evaluate the internal gettering ability against iron (Fe) contamination. In order to evaluate the internal gettering ability against iron (Fe), there was no other choice but to actually introduce a silicon wafer to a device process for measuring the concentration of residual iron (Fe). This involved problems of a lot of time, manhours, and cost required for the evaluation of the internal gettering ability.

This invention has been made in view of the problems described above. It is an object of the invention to enable correct prediction of internal gettering behavior without the need of actual measurement under any conditions including a practical range of gettering heat treatment temperature and oxygen precipitates density, and to make it possible to evaluate the internal gettering ability correctly and in a short period of time at a low cost.

Means to Solve Problems

A first aspect of the invention relates to a method of predicting internal gettering behavior in a silicon substrate by using an arithmetic expression established among an initial contamination concentration of a contaminant heavy metal in the silicon substrate, a density of oxygen precipitates, a radius of the oxygen precipitates, internal gettering heat treatment temperature, internal gettering heat treatment time, and a concentration of a contaminant a heavy metal remaining in the silicon substrate after a heat treatment, and the method is characterized in that an arithmetic expression is added considering a process in which nuclei of contaminant heavy metal silicide are generated on the surface of the oxygen precipitates, and a process in which the contaminant heavy metal is gettered by the oxygen precipitates having the contaminant heavy metal silicide nuclei generated on the surface thereof.

A second aspect of the invention according to the first aspect of the invention is characterized in that a density and/or a radius of the oxygen precipitates required for reducing the concentration of the contaminant heavy metal remaining in the silicon substrate after a heat treatment to a desired concentration or lower are/is obtained.

A third aspect of the invention according to the first aspect of the invention is characterized in that internal gettering heat treatment temperature and/or internal gettering heat treatment time required for reducing the concentration of the contaminant heavy metal remaining in the silicon substrate after a heat treatment to a desired concentration or lower are/is obtained.

A fourth aspect of the invention according to the first aspect of the invention is characterized in that the contaminant heavy metal is iron.

A fifth aspect of the invention relates to a storage medium storing a program for predicting internal gettering behavior in a silicon substrate by using an arithmetic expression established among an initial contamination concentration of a contaminant heavy metal in the silicon substrate, a density of oxygen precipitates, a radius of the oxygen precipitates, internal gettering heat treatment temperature, internal gettering heat treatment time, and a concentration of a contaminant a heavy metal remaining in the silicon substrate after a heat treatment, and is characterized in that the program stored in the storage medium is for predicting internal gettering behavior in a silicon substrate with an arithmetic expression being added considering a process in which nuclei of contaminant heavy metal silicide are generated on the surface of the oxygen precipitates, and a process in which the contaminant heavy metal is gettered by the oxygen precipitates having the contaminant heavy metal silicide nuclei generated on the surface thereof.

A sixth aspect of the invention according to the fifth aspect of the invention is characterized in that a density and/or a radius of the oxygen precipitates required for reducing the concentration of the contaminant heavy metal remaining in the silicon substrate after a heat treatment to a desired concentration or lower are/is obtained.

A seventh aspect of the invention according to the fifth aspect of the invention is characterized in that internal gettering heat treatment temperature and/or internal gettering heat treatment time required for reducing the concentration of the contaminant heavy metal remaining in the silicon substrate after a heat treatment to a desired concentration or lower are/is obtained.

An eighth aspect of the invention according to the fifth aspect of the invention is characterized in that the contaminant heavy metal is iron.

A description will be made on findings of this invention.

According to the above-described Gilles model, when the iron (Fe) concentration exceeds solubility due to temperature drop, supersaturated Fe atoms precipitate on the surface of oxygen precipitates as an iron silicide (contaminant heavy metal silicide; $FeSi_2$). These iron (Fe) atoms reach the surface of the oxygen precipitates by diffusion. It is assumed that the precipitation rate of the iron silicide can be controlled by the diffusion rate. Specifically, it is assumed that the precipitation rate of the iron silicide on the surface of the oxygen precipitates is sufficiently high so that excessive iron (Fe) atoms exceeding the solubility rapidly precipitate on the surface of the oxygen precipitates, and the precipitation rate is controlled by the diffusion rate of the iron (Fe) atoms. It is therefore presumed that the iron (Fe) concentration on the surface of the oxygen precipitates is kept at the solubility of iron (Fe).

In this manner, the conventional internal gettering model is on the assumption that supersaturated iron (Fe) exceeding the solubility precipitates on the surface of oxygen precipitates, and the precipitation rate is controlled by the diffusion rate of iron (Fe) atoms.

However, a process in which an iron silicide precipitates on the surface of oxygen precipitates inevitably involves generation and growth of nuclei thereof. Specifically, when iron becomes supersaturated, nuclei of an iron silicide are generated on the oxygen precipitates. The nuclei of the iron silicide then grow to start a process of precipitation of iron silicide. The oxygen precipitates having the iron silicide nuclei generated on the surface thereof function as an iron (Fe) gettering site during controlling of diffusion, and getter the iron (Fe). However, the oxygen precipitates having no iron silicide nuclei generated on the surface thereof do not function as an effective gettering site and do not getter the iron (Fe).

If the iron silicide precipitation process proceeds more slowly than the iron (Fe) diffusion process, the Gilles model will not work any more. Conversely, if the iron (Fe) diffusion process proceeds more slowly than the iron silicide precipitation process, the precipitation process is controlled by the diffusion process, and the diffusion controlling model proposed by Gilles et al. will work.

Gilles model substantially coincides with experimental data on gettering in a low-temperature region in which the iron (Fe) diffusion rate is low, presumably because this temperature region is the region where the iron (Fe) diffusion process proceeds more slowly than the iron silicide precipitation process, and hence the diffusion controlling conditions are satisfied.

This invention has been made based on the findings as described above. According to the invention, internal gettering behavior in a silicon substrate is predicted by using an arithmetic expression established among an initial iron contamination concentration $C_{ini}$ in the silicon substrate, a density N of oxygen precipitates, a radius R of the oxygen precipitates, internal gettering heat treatment temperature T, internal gettering heat treatment time t, and a concentration C(t) of iron (Fe) remaining in the silicon substrate after a heat treatment, while an arithmetic expression is added considering a process in which nuclei of a contaminant heavy metal silicide are generated on the surface of the oxygen precipitates, and a process in which the contaminant heavy metal is gettered by the oxygen precipitates having the contaminant heavy metal silicide nuclei generated on the surface thereof. This invention is also applicable for internal gettering of a contaminant heavy metal other than iron (Fe), such as copper (Cu), nickel (Ni) or the like (the first and fifth aspects of the invention).

According to the second and sixth aspects of the invention, as shown in FIG. 4, internal gettering behavior in a silicon substrate is predicted, and a density N of oxygen precipitates (on the horizontal axis of FIG. 4) and/or a radius R of the oxygen precipitates (on the vertical axis of FIG. 4) required for reducing the concentration of a contaminant heavy metal remaining in the silicon substrate after a heat treatment to a desired concentration (represented by the curves in FIG. 4) or lower are obtained.

According to the third and seventh aspects of the invention, as shown in FIG. 5, internal gettering behavior in a silicon substrate is predicted, and internal gettering heat treatment temperature T (on the vertical axis of FIG. 5) and/or internal gettering heat treatment time (on the horizontal axis of FIG. 5) required for reducing the concentration of a contaminant heavy metal remaining in the silicon substrate after a heat treatment to a desired concentration (represented by the curves in FIG. 5) or lower are obtained.

According to the fourth and eighth aspects of the invention, it is made possible to predict internal gettering behavior of iron, which is one of difficult contaminant heavy metals to getter.

According to this invention, internal gettering behavior in a silicon substrate is predicted by adding an arithmetic expression considering a process in which nuclei of a contaminant heavy metal silicide (iron silicide) are generated on the surface of oxygen precipitates, and a process in which the contaminant heavy metal (iron) is gettered by the oxygen precipitates having the nuclei of the contaminant heavy metal silicide (iron silicide) generated on the surface thereof. Accordingly, the internal gettering behavior can be predicted correctly and without the need of actual measurement under any conditions including a practical range of gettering heat treatment temperature and density of oxygen precipitates. This makes it possible to evaluate the internal gettering ability correctly and in a short period of time at a low cost.

BEST MODE FOR CARRYING OUT THE INVENTION

Embodiments of this invention will be described with reference to the drawings.

First, the findings of this invention will be described.

As described above, Gilles et al. used the expressions (3) and (4) to represent the internal gettering behavior (change in the iron (Fe) concentration) due to oxygen precipitates. It is reconfirmed that the expressions (3) and (4) work satisfactorily in a relatively low temperature range (200 to 300° C.) also by the report of Hieslmair et al., following Gilles et al.

As mentioned above, however, the model proposed by Gilles et al. is not able to explain the following two phenomena:

(1) The gettering relaxation time r varies in dependence on the initial iron (Fe) contamination concentration $C_{ini}$.

(2) The gettering rate drops substantially in a temperature range of 600 to 700° C. where iron (Fe) can be effectively gettered.

Thus, the Gilles model is not capable of predicting the gettering behavior in a practically effective manner.

The present inventor, therefore, examined the Gilles model and found, as a result, that Gilles model's problem is attributable to the assumption employed thereby.

More specifically, according to the Gilles model, when the temperature drops and the iron (Fe) concentration exceeds the solubility, supersaturated iron (Fe) atoms precipitate on the surface of oxygen precipitates as an iron silicide (contaminant heavy metal silicide; $FeSi_2$). The iron (Fe) atoms reach the surface of the oxygen precipitates by way of diffusion. It is assumed that the precipitation rate of the iron silicide is controlled by the diffusion rate. Specifically, it is assumed that the precipitation rate of the iron silicide is sufficiently high at the surface of the oxygen precipitates that excessive iron (Fe) atoms above the solubility rapidly precipitate on the surface of the oxygen precipitates, and the precipitation rate is controlled by the diffusion rate of the iron (Fe) atoms. It is thus presumed that the iron (Fe) concentration at the surface of the oxygen precipitates is kept at the solubility of iron (Fe).

Thus, the conventional internal gettering model as described above relies on the assumption that supersaturated iron (Fe) exceeding the solubility precipitates on the surface of oxygen precipitates and the precipitation rate thereof is controlled by the diffusion rate of iron (Fe) atoms.

However, the process in which an iron silicide precipitates on the surface of oxygen precipitates must involve a process of nuclei generation and growth. Specifically, when iron becomes saturated, nuclei of an iron silicide are generated on the oxygen precipitates. The nuclei of the iron silicide then grow, and the precipitation process starts. The oxygen precipitates having the iron silicide nuclei generated on the surface thereof function as an iron (Fe) gettering site during controlling of the diffusion, and getter the iron (Fe). On the other hand, the oxygen precipitates having no iron silicide nuclei generated on the surface thereof do not function as an effective gettering site, and do not getter the iron (Fe).

If the precipitation process of the iron silicide proceeds more slowly than the diffusion process of iron (Fe), the Gilles model does not work any more. Conversely, if the iron (Fe) diffusion process proceeds more slowly than the iron silicide precipitation process, the precipitation process will be controlled by the diffusion process, and the diffusion controlling model proposed by Gilles et al. will work.

It is presumable that the Gilles model substantially coincides with experimental data on gettering in a low temperature range where the iron (Fe) diffusion rate is low, because the diffusion process of iron (Fe) proceeds more slowly than the precipitation process of the iron silicide in that temperature range and thus the controlling conditions are satisfied.

Based on the findings above, the present inventor predicted internal gettering behavior in a silicon substrate by using an arithmetic expression established among an initial contamination concentration $C_{ini}$ of iron in the silicon substrate, a density N of oxygen precipitates, a radius R of the oxygen precipitates, internal gettering heat treatment temperature T, internal gettering heat treatment time t, and a concentration C(t) of iron (Fe) remaining in the silicon substrate after the heat treatment, while adding an arithmetic expression considering a process in which iron silicide nuclei are generated on the surface of the oxygen precipitates and a process in which iron is gettered by the oxygen precipitates having the iron silicide nuclei generated on the surface thereof.

A computation model (nuclei generation model) for the behavior prediction will be described. It is assumed here, for the purpose of simplification of the model, that the oxygen precipitates are distributed uniformly in the direction of the depth of the silicon wafer.

If it is assumed that iron silicide spheres with a radius Rs are formed on the surface of oxygen precipitates, a free energy change ΔG of the system can be represented by the following expression (5).

$$\Delta G = -(4\pi/3\Omega)Rs^3 k_b T \ln(C(t)/C^{eq}) + 4\pi Rs^2 \sigma \quad (5)$$

In this expression, Ω denotes a volume of each iron (Fe) in an iron silicide molecule, $k_b$ denotes a Boltzmann's constant, and T denotes absolute temperature (K). σ denotes a surface energy at the interface between the iron silicide and the silicon, and can be determined by fitting as described later.

A generation rate Is of iron silicide nuclei at the surface of the oxygen precipitates was given by the following expression (6).

$$Is = (4\pi Rs^* DC(t))Z(T)\rho \exp(-\Delta G^*/k_b T) \quad (6)$$

In this expression, the unit of Is is [1/sec·cm²]. Rs* denotes a critical nuclei radius of the iron silicide, which gives ∂ΔG/∂Rs=0, and is represented as $Rs^* = 2\sigma\Omega/\{k_b T \ln(C(t)/C^{eq})\}$. 4πRs*DC(t) denotes a frequency at which the iron (Fe) atoms come into contact with the critical nuclei during the diffusion. Z(T) is a Zeldovich factor, which can be determined by fitting as described later. σ denotes a density of atom site on the surface of the oxygen precipitates. σ exp(-ΔG*/$k_b$T) denotes an equilibrium density of the critical nuclei.

It was then assumed that the oxygen precipitates having the iron silicide nuclei generated on the surface thereof would become an effective iron (Fe) gettering site during controlled diffusion, and the oxygen precipitates having no iron silicide nuclei generated on the surface thereof would not contribute to iron (Fe) gettering.

The number ΔNs of oxygen precipitates having iron silicide nuclei generated on the surface thereof in a time interval Δt can be represented by the following expression (7).

$$\Delta Ns(t) = Is(t) 4\pi R^2 (N - Ns) \Delta t (\text{units/cm}^3) \quad (7)$$

In this equation, N denotes a density of the oxygen precipitates, and Ns denotes a density of the oxygen precipitates already having the iron silicide nuclei generated thereon.

Accordingly, the density Ns of the oxygen precipitates having iron silicide nuclei generated on the surface thereof can be obtained by performing integration at every time interval Δt, and can be represented by the following expression (8).

$$Ns(t) = \int Is(t) 4\pi R^2 (N - Ns(t)) dt \quad (8)$$

The integration range in the expression (8) is from t=0 to t=t.

The time change ∂C(t)/∂ of the iron (Fe) concentration C(t) at the time t can be obtained by assigning "the density Ns(t) of the oxygen precipitates having the iron silicide nuclei generated on the surface thereof" to "the density N of the oxygen precipitates" in the expression (2), that is, (∂C(t)/∂t=-4πRD(C(t)-$C^{eq}$)N).

These computations can be performed by numerical computation using the finite difference method.

Specifically, the density Ns(t) in the effective gettering site during the internal gettering heat treatment is obtained by using the arithmetic expression (8) of the nuclei generation model, and the density Ns(t) thus obtained is assigned to the expression (2) to compute the time change ∂C(t)/∂t in the iron (Fe) concentration. The residual iron (Fe) concentration C(t) at an arbitrary time t can be predicted by repeating such computation using the difference method.

In order to ensure the correctness of the computation model described above, indefinite parameters in the computation model, that is, surface energy σ and Z(T) were used as fitting parameters and compared with various experimental data. As a result, it was found that it was possible with the present computation model to accurately predict the iron (Fe) concentration by assigning the values of σ=110 (erg/cm²), and Z(T)=3.43×10⁻¹⁶ exp (1.63 eV/$k_b$T).

In order to simplify the computation, the computation model according to this invention is based on the assumption that oxygen precipitates are distributed uniformly in the direction of the depth of a silicon wafer. In this case, there is no need to consider the diffusion of iron (Fe) atoms in the depth direction of the wafer. However, if a defect-free surface layer (Denuded Zone) having no oxygen precipitates near the surface layer of the wafer, gettering will occur only within the wafer but not in the surface layer, and hence computation must be performed in consideration of the diffusion of iron (Fe) in the depth direction of the wafer. Specifically, the computation must be performed on the process in which the iron (Fe) concentration within the wafer is reduced due to the gettering by the oxygen precipitates, and the iron (Fe) atoms are diffused from the surface layer having a high iron (Fe) concentration to the inside of the wafer. For this purpose, the density N and radius R of the oxygen precipitates can be set for each of sections obtained by dividing the wafer in the depth direction thereof, and the above-mentioned computation model can be applied to obtain the iron (Fe) concentration for each of the sections, while computing the diffusion between the sections. However, comparing the case in which the computation is performed on the assumption that the oxygen precipitates are distributed uniformly in the depth direction of the wafer and the case in which the computation is performed on the assumption that a defect-free surface layer is formed near the surface layer of the silicon wafer, there is no significant difference in the computation results while only slight delay in the change in the iron (Fe) concentration is reflected on the computation results. Consequently, either of these assumptions may be applicable in this invention.

Further, for the purpose of simplifying the computation, the computation model described above is based on the assumption that the radius R of the oxygen precipitates remains fixed even after precipitation of the iron silicide. This assumption is reasonable when the iron (Fe) concentration is low or the radius R of the oxygen precipitates is great, since any change in the radius R due to the precipitation of iron (Fe) is ignorable. On the contrary, when any increase in the radius of the oxygen precipitates due to precipitation of iron silicide is not ignorable, it is desirable for obtaining a more accurate computation result to change the radius R of the oxygen precipitates in the expressions (2) and (8) by increasing the same by the amount of precipitated iron silicide. This change can be done very easily in the computation using the difference method. In practice, however, it is believed that there is little need to change the radius R of the oxygen precipitates by increasing the same.

The computation can be performed also for a wafer having an epitaxial layer formed therein, by applying a similar concept to that for a wafer having a defect-free surface layer. Further, parameters such as a diffusion coefficient are sometimes varied by a dopant. In this case, the computation should be performed in consideration of the variation in the parameters.

EXAMPLE 1

FIG. 1 shows comparison results between experimental results by Hieslmair et al. and computation results according this invention. The horizontal axis represents internal gettering heat treatment temperature, and the vertical axis represents effective gettering site density after a heat treatment of the silicon wafer.

First, the experiments conducted by Hieslmair et al. and results thereof will be described (see Non-Patent Document 3).

Hieslmair et al. conducted experiments on silicon wafers having four differently adjusted densities of oxygen precipitates while variously changing the internal gettering heat treatment temperature. The initial contamination concentration $C_{ini}$ of iron (Fe) is (2 to 4)×10$^{13}$ (atoms/cm$^3$). Subsequently, relation between gettering heat treatment time t and iron (Fe) concentration C(t) at each temperature was obtained by measuring the same, and gettering relaxation time τ was obtained by fitting the result thus obtained to the expression (3). The relaxation time τ was then assigned to the expression (4) to obtain an effective gettering site density Ns. Their experiments results are plotted in FIG. 1. It can be seen therefrom that the effective gettering site density Ns is reduced as the heat treatment temperature T is increased.

Computation was performed using the computation model of this invention under the same conditions as those of the experiments by Hieslmair et al. Specifically, the relation between the gettering heat treatment time t and the iron (Fe) concentration C(t) was obtained by the computation under the same conditions as those of the experiments by Hieslmair et al, and the relation was fitted to the expression (3) to find gettering relaxation time τ. The relaxation time T thus found was assigned to the expression (4) to obtain an effective gettering site density Ns. FIG. 1 shows four different curves respectively representing computation results of effective gettering site densities in silicon wafers having four different densities of oxygen precipitates.

It can be seen from FIG. 1 that the four curves obtained by the computation model according to this invention coincide relatively well with the plots indicating the experimental results of Hielsmair et al. For example, in the case of the wafer having the highest density of oxygen precipitates, the effective gettering site density Ns is flat until the internal gettering heat treatment temperature reaches about 400° C., and then follows a curve to rapidly declines with a substantially fixed gradient as the heat treatment temperature T is increased. This curve substantially coincides with the data obtained by Hieslmair et al., and so do the other curves.

As a result of careful review of the data shown in FIG. 1, it was found that the reason could be presumed as follows why the effective gettering site density Ns dropped more notably than the density N of the oxygen precipitates if heat treatment was conducted at a high temperature when the density N of oxygen precipitates was high.

When the density N of the oxygen precipitates is high and the heat treatment temperature T is high, the gettering rate of iron (Fe) atoms becomes high, and hence the iron (Fe) concentration rapidly drops. It is believed that the nuclei generation on the surface of the oxygen precipitates is thus suppressed in a short period of time, and only a part of the oxygen precipitates functions as an effective gettering site.

Using the computation model (nuclei generation model) according to this invention as described above, it is possible to explain the phenomena that were conventionally difficult to explain, and also possible to predict quantitatively the effective gettering site density Ns.

EXAMPLE 2

As described in the above, it was conventionally difficult to explain the dependency of gettering relaxation time τ on the initial iron (Fe) contamination concentration $C_{ini}$. Example 2 proves that the relation between the initial iron (Fe) contamination concentration $C_{ini}$ and the gettering relaxation time r can be predicted with a computation method using the computation model of the invention, and thus this problem can be solved.

Example 2 involves the conditions as follows.

First, four silicon wafers were immersed in SC1 cleaning solution (mixed solution of ammonia and hydrogen peroxide) containing iron (Fe) to contaminate the wafers with iron (Fe), and then subjected to iron (Fe) diffusion processing at 1000° C. Subsequently, these wafers were quenched from the diffusion processing temperature. The initial iron (Fe) contamination concentration directly after the quenching was 3×10$^{12}$, 1×10$^{13}$, 3×10$^{13}$, and 1×10$^{14}$ (atoms/cm$^3$), respectively.

Subsequently, the change in iron (Fe) concentration in the silicon wafers was measured by the DLTS (Deep Level Transient Spectroscopy) method with the internal gettering heat treatment temperature T set to 600° C. while variously varying the internal gettering heat treatment time t. The density N of oxygen precipitates was 3×10$^{10}$ (units/cm$^3$), and the radius R of the oxygen precipitates was 30 nm. The radius R of the oxygen precipitates was an estimated sphere radius obtained based on a value obtained by dividing the amount of precipitated oxygen measured with a Fourier transform infrared spectrophotometer (FTIR) by the density N of the oxygen precipitates. The heat treatment time t was in the range from zero to 200 seconds. The iron (Fe) concentration obtained from the experimental results was plotted in FIG. 2 after being normalized in the form of the expression (3).

For comparison, computation was performed using the computation model of this invention under the same conditions as the experimental conditions described above.

The curves in FIG. 2 represent computation results, and it can be seen therefrom that the curves well coincide with the plots of the experimental results. It can be seen from FIG. 2 that the gettering relaxation time τ becomes shorter, as the initial contamination concentration $C_{ini}$ is increased. The reason why the gettering relaxation time τ becomes shorter as the initial iron (Fe) contamination concentration $C_{ini}$ is increased is that the density Ns of the effective gettering site is high and the generation rate of iron silicide nuclei on the surface of the oxygen precipitates is high.

Thus, it is possible to predict quantitatively the phenomena that were conventionally difficult to explain, by using the computation model according to this invention as described above.

EXAMPLE 3

Example 3 is for predicting the relation between silicon wafer cooling rate and iron (Fe) concentration. Experimental results were compared with computation results by the computation model of this invention.

A description will be made on experimental conditions.

First, a plurality of silicon wafers were immersed in SC1 cleaning solution (mixed solution of ammonia and hydrogen peroxide) containing iron (Fe) to be contaminated with iron (Fe), and then subjected to iron (Fe) diffusion processing at 1000° C. The initial iron (Fe) contamination concentration $C_{ini}$ was set to $2\times10^{13}$ (atoms/cm$^3$). These wafers were then cooled at various cooling rates, and the concentration of iron (Fe) remaining after the cooling was measured by using the DLTS method. The density N of oxygen precipitates was $3\times10^9$ (units/cm$^3$) and the radius R of the oxygen precipitates was 50 nm. The radius R of the oxygen precipitates was an estimated sphere radius obtained based on a value obtained by dividing the amount of precipitated oxygen measured with a Fourier transform infrared spectrophotometer (FTIR) by the density N of the oxygen precipitates.

For comparison, computation was performed on the change in iron (Fe) concentration in the silicon wafers after cooling by using the computation model of this invention under the same conditions as the experimental conditions described above.

The curves in FIG. 3 show the computation results, and it can be seen that the curves well coincide with the plots of the experimental results.

Thus, the iron (Fe) concentration in the silicon wafers after cooling can be predicted quantitatively by using the computation model according to this invention as described above.

EXAMPLE 4

Example 4 as shown in FIG. 4 is for obtaining, by means of computation, a density N and radius R of oxygen precipitates required for reducing the concentration iron (Fe) remaining in a silicon substrate after a heat treatment to a desired concentration or lower.

In this Example 4, the internal gettering temperature T was set to 600° C., and the heat treatment time t was set to 30 minutes. The initial iron (Fe) contamination concentration $C_{ini}$ was $2\times10^{13}$ (atoms/cm$^3$).

The horizontal axis in FIG. 4 represents density N of oxygen precipitates, and the vertical axis represents radius R of the oxygen precipitates. Curves in FIG. 4 are contour lines corresponding the concentrations of iron (Fe) remaining after the internal gettering heat treatment, $10^{11}$, $3\times10^{11}$, $10^{12}$, $3\times10^{12}$, and $10^{13}$ (atoms/cm$^3$), respectively.

According to FIG. 4, it can be easily determined how the density N and radius R of oxygen precipitates should be set in order to reduce the iron (Fe) concentration from the iron (Fe) concentration shown by the relevant contour line (curve) to a desired iron (Fe) concentration, when the initial iron (Fe) contamination concentration $C_{ini}$ is $2\times10^{13}$ (atoms/cm$^3$) and the internal gettering heat treatment conditions are 600° C. and 30 minutes, for example. Once the density N and radius R of the oxygen precipitates are determined based on FIG. 4, the oxygen concentration in the silicon crystal and the like may be controlled such that the density N an the radius R can be obtained.

Even when the initial iron (Fe) contamination concentration $C_{ini}$ and the internal gettering heat treatment conditions are changed, it can be easily determined how the density N and radius R of oxygen precipitates should be set in order to reduce the iron (Fe) concentration to a desired iron (Fe) concentration, by drawing similar contour lines (curves) to those in FIG. 4 for respective iron (Fe) concentrations.

Although it is assumed in FIG. 4 that the internal gettering heat treatment temperature T is fixed (at 600° C.), similar contour lines (curves) to those in FIG. 4 representing the iron (Fe) concentrations can be drawn not only when the temperature is fixed but also when the heat treatment temperature is changed in various patterns, whereby it can be easily determined how the density N and radius R of the oxygen precipitates should be set in order to reduce the iron (Fe) concentration to a desired iron (Fe) concentration.

Further, the radius R of the oxygen precipitates may be obtained by assigning a value of the density N of the oxygen precipitates. Conversely, the density N of the oxygen precipitates may be obtained by assigning a value of the radius R of the oxygen precipitates.

EXAMPLE 5

Example 5 as shown in FIG. 5 is for obtaining internal gettering heat treatment temperature T and internal gettering heat treatment time t required for reducing the concentration of iron (Fe) remaining in a silicon substrate after a heat treatment to a desired concentration or lower.

In this Example, the density N of oxygen precipitates was set to $2\times10^9$ (units/cm$^3$) and the radius R of the oxygen precipitates was set to 50 nm. The initial iron (Fe) contamination concentration $C_{ini}$ was $2\times10^{13}$ (atoms/cm$^3$).

The horizontal axis in FIG. 5 represents internal gettering heat treatment time t, and the vertical axis represents internal gettering heat treatment temperature T. Curves in FIG. 5 are contour lines corresponding to concentrations of iron (Fe) remaining after an internal gettering heat treatment, $3\times10^{10}$, $10^{11}$, $3\times10^{11}$, $10^{12}$, $3\times10^{12}$ and $10^{13}$ (atoms/cm$^3$), respectively.

According to FIG. 5, it can be easily determined how the internal gettering heat treatment temperature T and the internal gettering heat treatment time t should be set in order to reduce the iron (Fe) concentration from the iron (Fe) concentration shown by the relevant contour line (curve) to a desired iron (Fe) concentration, for example when the initial iron (Fe) contamination concentration $C_{ini}$ is $2\times10^{13}$ (atoms/cm$^3$), the density N of the oxygen precipitates is $2\times10^9$ (units/cm$^3$), and the radius R of the oxygen precipitates is 50 nm. Once the internal gettering heat treatment temperature T and the internal gettering heat treatment time t are determined based on FIG. 5, the internal gettering heat treatment may be performed such that such temperature T and time t can be obtained.

Even when the initial iron (Fe) contamination concentration $C_{ini}$, the density N of the oxygen precipitates, and the radius R of the oxygen precipitates are changed, it can be easily determined how the internal gettering heat treatment temperature T and the internal gettering heat treatment time t should be set in order to reduce the iron (Fe) concentration to a desired iron (Fe) concentration, by drawing similar contour lines (curves) to those in FIG. 5 for respective iron (Fe) concentrations.

Further, the internal gettering heat treatment time t may be obtained by assigning a value of the internal gettering heat treatment temperature T, and the internal gettering heat treatment temperature T may be obtained by assigning a value of the internal gettering heat treatment time t.

EXAMPLE 6

The computation described in Examples 1 to 5 can be performed by a program stored in a storage medium.

FIG. 6 is a flowchart showing an example of a program stored in the storage medium for pre-computing an iron (Fe) concentration C(t) at each time t.

Particulars of the program will be described according to the flow of the flowchart in FIG. 6.

First, the density N and radius R of oxygen precipitates, the initial iron (Fe) contamination concentration $C_{ini}$ in a silicon wafer, and the time-change pattern of internal gettering temperature, that is, the relation between the internal gettering heat treatment temperature T and the heat treatment time t is loaded (step S10).

Subsequently, a time variable used for the computation is initialized (step S11) to start time marching loop (step S12). The time variable is updated (step S13), temperature is set corresponding to the time (step S14), and a physical constant is set (step S15).

It is then determined whether or not the iron (Fe) concentration C(t) of the silicon wafer currently being computed is higher than the solubility (step S16). If the iron (Fe) concentration C(t) is higher than the solubility, supersaturated iron (Fe) atoms will precipitate on the surface of oxygen precipitates as an iron silicide (determined YES in step S16). Therefore, the process proceeds to the next step S17 to compute a density Ns of oxygen precipitates having the iron silicide generated on the surface thereof.

In step S17, the expressions (6) to (8) are used to compute the density Ns(t) of oxygen precipitates having nuclei of the iron silicide generated on the surface thereof (step S17).

Subsequently, the time change $\partial C(t)/\partial t$ of the iron (Fe) concentration C(t) at the time t is computed by assigning "the density Ns(t) of the oxygen precipitates having the nuclei of the iron silicide generated on the surface thereof" as obtained in step S17 to "the density N of the oxygen precipitates" in the expression (2) (step S18).

Subsequently, the residual concentration C(t) of iron (Fe) at the time t is computed based on the time change $\partial C(t)/\partial t$ of the iron (Fe) concentration C(t) at the time t obtained by the computation in step S18 (step S19).

It is then determined whether or not the time marching loop has terminated (step S20).

On the other hand, if the iron (Fe) concentration C(t) is determined to be lower than the solubility in step S16, no iron silicide precipitation (internal gettering) will occur (determined NO in step S16). Accordingly, the process proceeds to step S20 without computing the density Ns of oxygen precipitates having the iron silicide generated on the surface thereof (step S17), and it is determined whether or not the time marching loop has terminated (step S20).

If the heat treatment time t has not reached its final time (determined NO in step S20), the process returns to step S12, and the same process is repeated again.

When the heat treatment time t has reached its final time (determined YES in step S20), the computation result of the residual iron (Fe) concentration C(t) at each time t is output externally (step S21).

This flowchart shows steps of computation for the gettering as described in Examples 1 to 5 when wafers contaminated at high temperature are subjected to heat treatment at a gettering temperature lower than the contamination temperature. This corresponds to a general gettering process.

On the other hand, if computation is required for a complicated heat treatment process in which a wafer which has once experienced a gettering processing is again heated to high temperature, a process of reemission of the iron (Fe) gettered by the oxygen precipitates must be added to the computation.

In this case, the process proceeds to the reemission computation instead of skipping to step S20 when it is determined NO in step S16. This means that the process proceeds from step S16 to step S18, skipping step S17, until all the iron (Fe) gettered and accumulated in the oxygen precipitates is emitted. After all the iron (Fe) accumulated in the oxygen precipitates has been emitted, the process follows the flow to skip from step S16 to step S20. Therefore, it is necessary to add a computation step of an amount iron (Fe) accumulated in the oxygen precipitates. When designed as described above, the flow will be effective for any complicated process. In general usage, however, the evaluation according to the flow of Example 6 will suffice.

Although the description of the examples above has been made on the assumption that the heavy metal contaminating the silicon wafer is iron (Fe), the silicon wafer contaminating heavy metal is not limited to iron (Fe) according to this invention, but the invention is applicable to various other contaminant heavy metals such as copper (Cu) and nickel (Ni).

According to the examples as described above, the internal gettering behavior in a silicon substrate is predicted by adding an arithmetic expression taking into consideration of a process in which nuclei of contaminant heavy metal silicide (iron silicide) are generated on the surface of oxygen precipitates, and a process in which the contaminant heavy metal (iron) is gettered by the oxygen precipitates having the nuclei of the contaminant heavy metal silicide (iron silicide) generated on the surface thereof. Therefore, the internal gettering behavior can be predicted correctly without actual measurement under any conditions including a practical range of gettering heat treatment temperature and oxygen precipitate density. This makes it possible to evaluate the internal gettering ability correctly and in a short period of time at a low cost.

Figure 1:
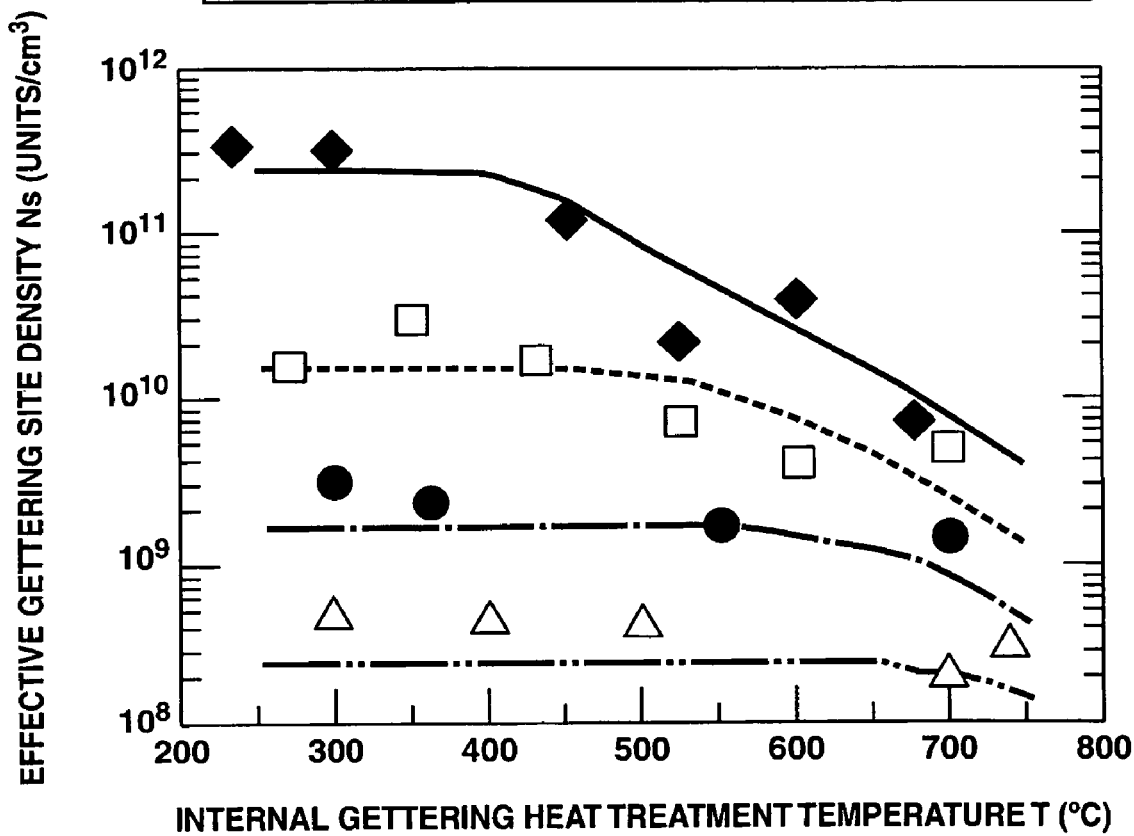
FIG. 1 is a diagram showing relation between internal gettering temperature and effective gettering site density for each density of oxygen precipitates.
Figure 2:
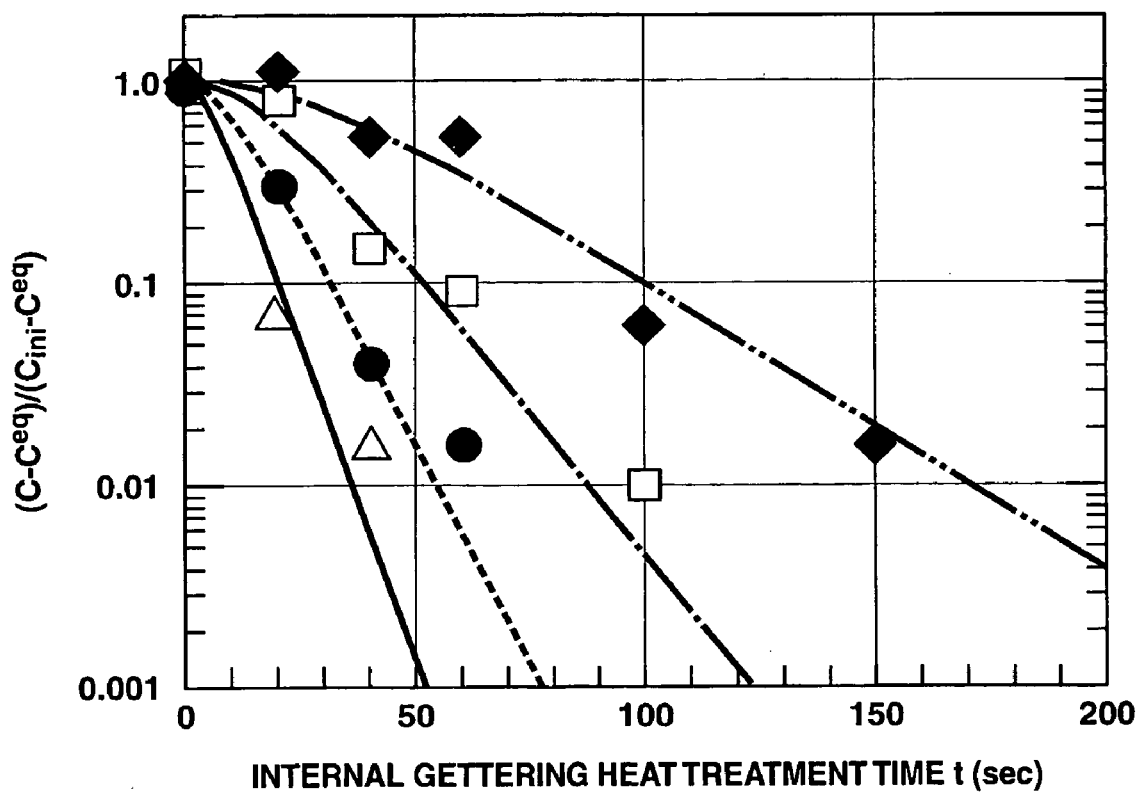
FIG. 2 is a diagram showing relation between internal gettering heat treatment time and normalized iron (Fe) concentration for each of initial contamination concentration.
Figure 3:
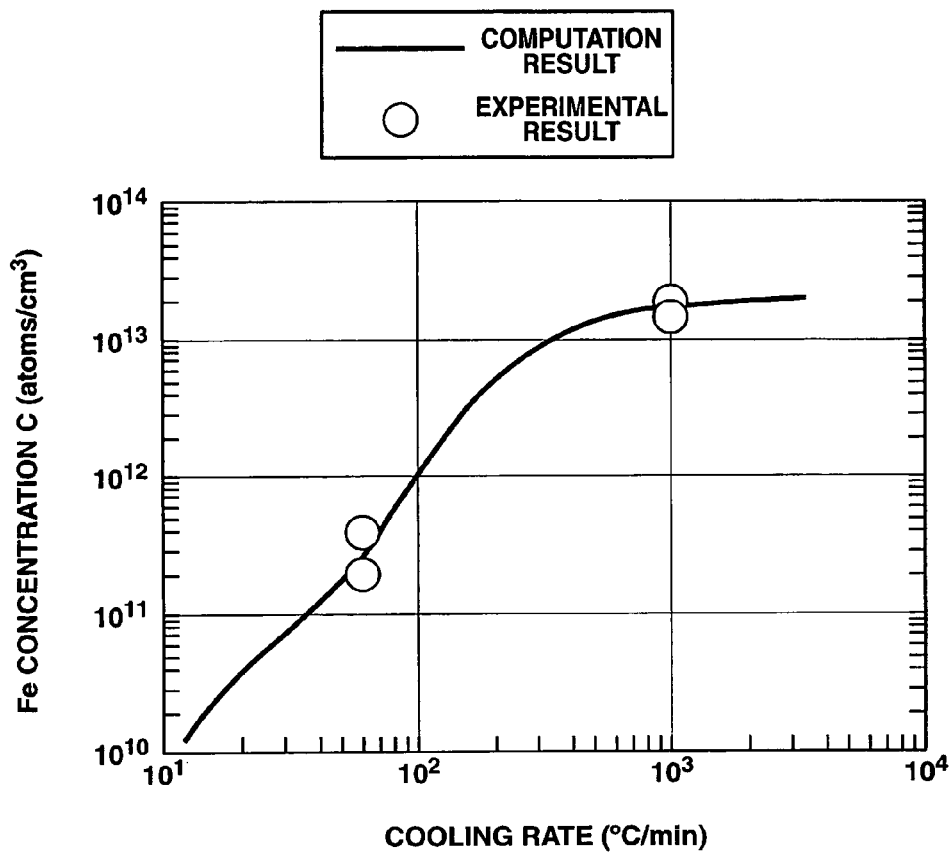
FIG. 3 is a diagram showing relation between cooling rate and residual iron (Fe) concentration.
Figure 4:
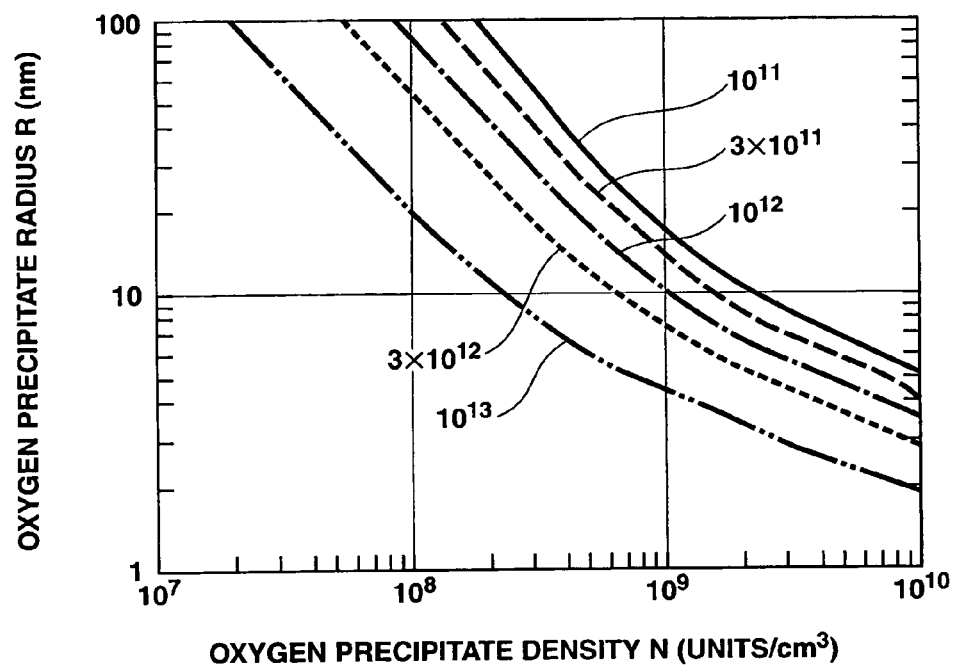
FIG. 4 is a diagram showing relation between density of oxygen precipitates and radius of oxygen precipitates for each desired iron concentration.
Figure 5:
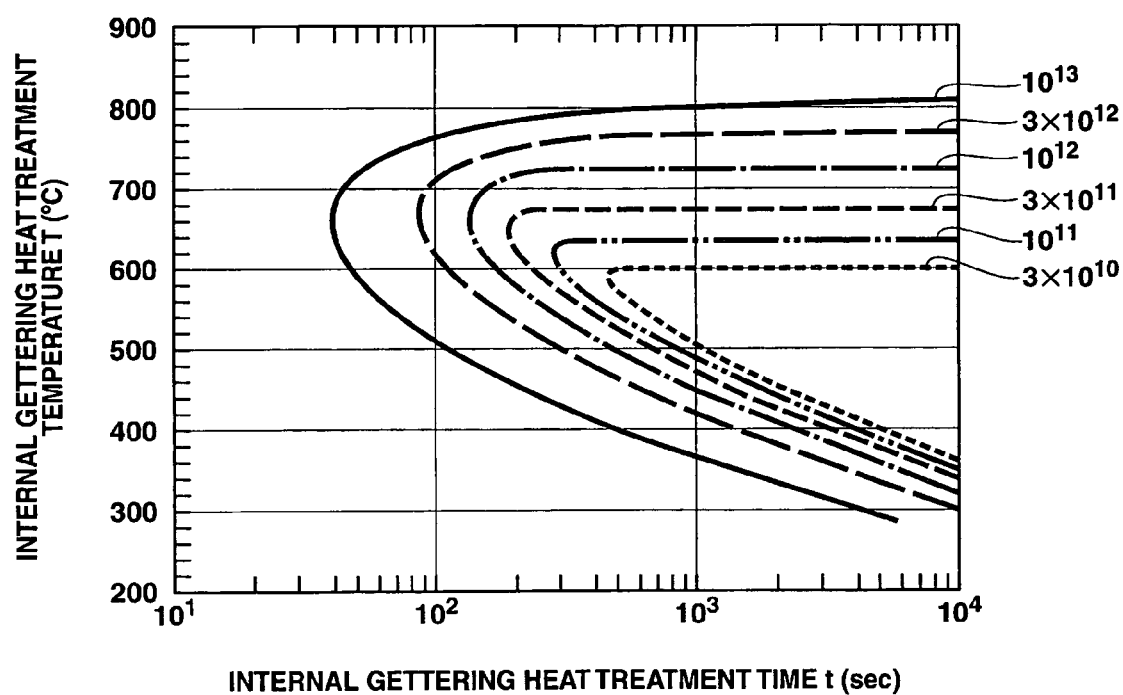
FIG. 5 is a diagram showing relation between internal gettering heat treatment time and internal gettering heat treatment temperature for each desired iron concentration.
Figure 6:
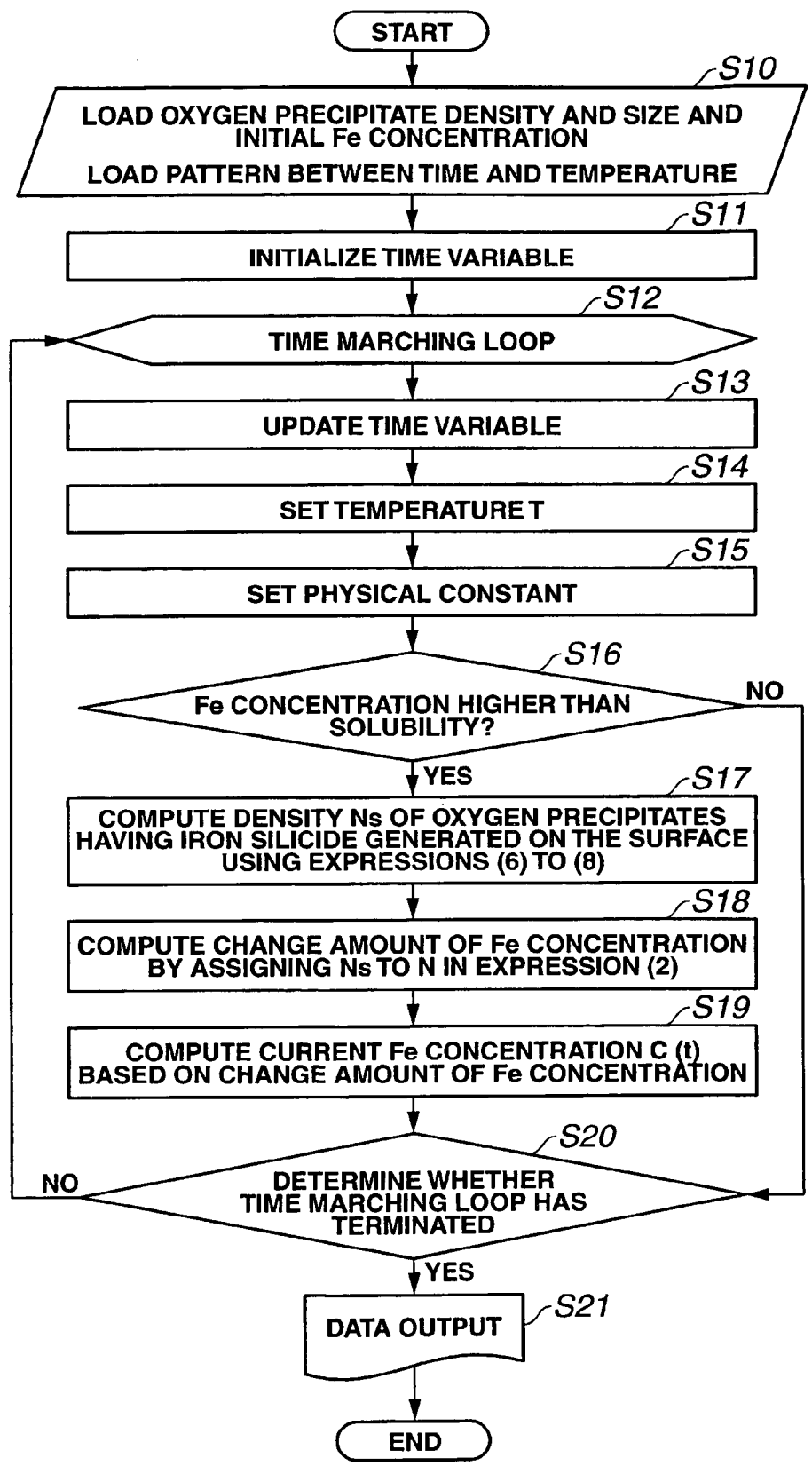
FIG. 6 is a flowchart showing an example of a program for prediction of internal gettering behavior.

The invention claimed is:

1. A method of predicting internal gettering behavior in a silicon substrate, comprising the steps of:

determining, with an arithmetic device, a generation rate Is of a contaminant heavy metal silicide nuclei at a surface of oxygen precipitates from an arithmetic expression, $$Is=(4\pi Rs^*DC(t))Z(T)\rho \exp(-\Delta G^*/kbT)$$

wherein Rs* is a critical nuclei radius of the contaminant heavy metal silicide;
D is a diffusion coefficient of a contaminant heavy metal;
C(t) is a concentration of the contaminant heavy metal within a silicon wafer at a time t;
$4\pi Rs^*DC(t)$ is a frequency at which contaminant heavy metal atoms come into contact with a critical nuclei by diffusion;
Z(t) is a Zeldovich factor;
$\rho$ is a density of an atom site on the surface of the oxygen precipitates;
$\Delta G^*$ is a free energy change of a system at the time when the contaminant heavy metal silicide are formed on the surface of the oxygen precipitates;
kb is a Boltzmann's constant;
T is absolute temperature;
$\rho \exp(-\Delta G^*/kbT)$ is an equilibrium density of the critical nuclei;
determining with an arithmetic device a density Ns(t) in an effective gettering site during an internal gettering heat treatment from an arithmetic expression, $$Ns(t)=\int_{t=0}^{t=t}Is(t)4\pi R^2(N-Ns(t))dt$$

wherein Is is a nucleic generation rate
R is a radius of the oxygen precipitates;
N is a density of the oxygen precipitates;
calculating with an arithmetic device a time change $\partial C(t)/\partial t$ of the contaminant heavy metal concentration by assigning the determined density Ns(t) to an arithmetic expression, $$\partial C(t)/\partial t=-4\pi RD(C(t)-C^{eq})Ns(t)$$

wherein R is the radius of the oxygen precipitates;
D is the diffusion coefficient of the contaminant heavy metal;
C(t) is the concentration of the contaminant heavy metal within the silicon wafer at a time t;
$C^{eq}$ is a solubility of the contaminant heavy metal; and
repeating the above arithmetic calculations with an arithmetic device, using a finite difference method to predict a residual concentration C(t) of the contaminant heavy metal at an arbitrary time t.

2. The method according to claim 1, wherein a density and/or a radius of the oxygen precipitates required for reducing the concentration of the contaminant heavy metal remaining in the silicon substrate after a heat treatment to a desired concentration or lower are/is obtained.

3. The method according to claim 1, wherein internal gettering heat treatment temperature and/or internal gettering heat treatment time required for reducing the concentration of the contaminant heavy metal remaining in the silicon substrate after a heat treatment to a desired concentration or lower are/is obtained.

4. The method according to claim 1, wherein the contaminant heavy metal is iron.

5. A storage medium storing a program to execute a process for predicting internal gettering behavior in a silicon substrate, the process comprising:

determining with an arithmetic device a generation rate Is of a contaminant heavy metal silicide nuclei at a surface of oxygen precipitates from an arithmetic expression, $$Is=(4\pi Rs^*DC(t))Z(T)\rho \exp(-\Delta G^*/kbT)$$

wherein Rs* is a critical nuclei radius of the contaminant heavy metal silicide;
D is a diffusion coefficient of a contaminant heavy metal;
C(t) is a concentration of the contaminant heavy metal within a silicon wafer at a time t;
$4\pi Rs^*DC(t)$ is a frequency at which contaminant heavy metal atoms come into contact with a critical nuclei by diffusion;
Z(T) is a Zeldovich factor;
$\rho$ is a density of an atom site on the surface of the oxygen precipitates;
$\Delta G^*$ is a free energy change of a system at the time when the contaminant heavy metal silicide are formed on the surface of the oxygen precipitates;
kb is a Boltzmann's constant;
T is absolute temperature;
$\rho \exp(-\Delta G^*/kbT)$ is an equilibrium density of the critical nuclei;
determining with an arithmetic device a density Ns(t) in an effective gettering site during an internal gettering heat treatment from an arithmetic expression, $$Ns(t)=\int_{t=0}^{t=t}Is(t)4\pi R^2(N-Ns(t))dt$$

wherein Is is a nucleic generation rate;
R is a radius of the oxygen precipitates;
N is a density of the oxygen precipitates;
calculating a time change $\partial C(t)/\partial t$ of the contaminant heavy metal concentration with an arithmetic device by assigning the determined density Ns(t) to an arithmetic expression, $$\partial C(t)/\partial t=-4\pi RD(C(t)-C^{eq})Ns(t)$$

wherein R is the radius of the oxygen precipitates;
D is the diffusion coefficient of the contaminant heavy metal;
C(t) is the concentration of the contaminant heavy metal within the silicon wafer at a time t;
$C^{eq}$ is a solubility of the contaminant heavy metal; and
repeating the above arithmetic calculations, with an arithmetic device, using a finite difference method to predict a residual concentration C(t) of the contaminant heavy metal at an arbitrary time t.

6. The storage medium according to claim 5, wherein a density and/or a radius of the oxygen precipitates required for reducing the concentration of the contaminant heavy metal remaining in the silicon substrate after a heat treatment to a desired concentration or lower are/is obtained.

7. The storage medium according to claim 5, wherein internal gettering heat treatment temperature and/or internal gettering heat treatment time required for reducing the concentration of the contaminant heavy metal remaining in the silicon substrate after a heat treatment to a desired concentration or lower are/is obtained.

8. The storage medium according to claim 5, wherein the contaminant heavy metal is iron.

* * * * *